(12) United States Patent
Han et al.

(10) Patent No.: US 11,368,127 B2
(45) Date of Patent: Jun. 21, 2022

(54) ACTIVE MIXER AND METHOD FOR IMPROVING GAIN AND NOISE

(71) Applicant: THE INDUSTRY & ACADEMIC COOPERATION IN CHUNGNAM NATIONAL UNIVERSITY, Daejeon (KR)

(72) Inventors: Junghwan Han, Daejeon (KR); Beomsoo Bae, Gyeonggi-do (KR)

(73) Assignee: THE INDUSTRY & ACADEMIC COOPERATION IN CHUNGNAM NATIONAL UNIVERSITY, Daejeon (KR)

(*) Notice: Subject to any disclaimer, the term of this patent is extended or adjusted under 35 U.S.C. 154(b) by 0 days.

(21) Appl. No.: 17/226,982

(22) Filed: Apr. 9, 2021

(65) Prior Publication Data

US 2022/0085761 A1 Mar. 17, 2022

(30) Foreign Application Priority Data

Sep. 11, 2020 (KR) .......................... 10-2020-0117031

(51) Int. Cl.
*H03D 7/14* (2006.01)
*H03D 7/12* (2006.01)

(52) U.S. Cl.
CPC .......... *H03D 7/1441* (2013.01); *H03D 7/125* (2013.01); *H03D 7/1458* (2013.01); *H03D 7/1483* (2013.01)

(58) Field of Classification Search
CPC combination set(s) only.
See application file for complete search history.

(56) References Cited

U.S. PATENT DOCUMENTS

| 9,276,620 B2* | 3/2016 | Han | .................... H03D 7/1491 |
| 2014/0226759 A1* | 8/2014 | Han | .................... H03D 7/1491 |
| | | | 375/317 |

FOREIGN PATENT DOCUMENTS

KR 101146163 B1 5/2012

* cited by examiner

*Primary Examiner* — Long Nguyen
(74) *Attorney, Agent, or Firm* — Levenfeld Pearlstein, LLC

(57) ABSTRACT

An active mixer for frequency conversion used in a wireless communication system improves conversion gain and noise figure by improving switching characteristics of a mixer using a LO signal without requiring additional power consumption of an active mixer block. Further disclosed is a method for improving conversion gain and noise figure of an active mixer. The active mixer includes a switching stage for receiving a LO signal and selectively performing a switching-on/off operation for frequency conversion, a body signal generator for generating a body signal to be applied to a body of an NMOS transistor of the switching stage based on the LO signal, and a voltage controller for controlling the body signal generator to selectively apply the body signal to the body of the NMOS transistor based on to the switching-on/off operation of the switching stage to control a threshold voltage of the transistor of the switching stage.

7 Claims, 14 Drawing Sheets

ACTIVE MIXER AND METHOD FOR IMPROVING GAIN AND NOISE

CROSS REFERENCE TO RELATED APPLICATION

The present application claims priority to Korean Patent Application No. 10-2020-0117031, filed Sep. 11, 2020, the entire contents of which is incorporated herein for all purposes by this reference.

BACKGROUND OF THE INVENTION

1. Field of the Invention

The present invention relates to an active mixer and method for improving gain and noise. More particularly, the present invention relates to an active mixer and method for improving gain and noise, the mixer and method being capable of improving conversion gain and noise performance of a mixer by improving the switching operation characteristics of the mixer using a signal of a local oscillator (LO) without requiring additional power consumption of an active mixer block for frequency conversion in a wireless communication system.

2. Description of the Related Art

In the case of a millimeter wave frequency band (30 GHz or more) generally used in 5G mobile communication, there is a phenomenon in which a mixer block experiences deterioration in gain and noise due to increased parasitic capacitance and low transit frequency.

For this reason, a low-noise amplifier is designed to be supplied with an increased amount of current to compensate for a decreased gain of a receiver. In addition, since gain and noise characteristics of a mixer, which are degraded according to the Friis formula, have a considerable impact on the next stage of the mixer, the signal-to-noise ratio (SNR) and sensitivity of a receiver are deteriorated.

In order to solve these problems, conventionally, an increased amount of current or a higher power of a LO signal is applied to an active mixer. However, these methods are not desirable in terms of a low-power circuit. Therefore, a configuration that can improve conversion gain and noise performance of an active mixer without requiring additional power consumption or without increasing a LO signal power is required.

In addition, for an ideal frequency conversion operation in an active mixer, it is necessary to implement a perfect switch driven with a signal (hereinafter, referred to as a LO signal) of a local oscillator (LO). However, in a metal oxide semiconductor field effect transistor (MOSFET) used as a switch, a switching delay occurs due to an inherent rising/falling time during a switching operation of the transistor.

In addition, even in a switched-on state, an additional gain loss occurs for a signal due to the on-resistance ($R_{ON}$) of the transistor. On the other hand, switching operation characteristics of the switch are improved by applying a relatively large LO signal or using a relatively large transistor. However, these methods have the disadvantages of increasing the influence of parasitic capacitance and of increasing power consumption.

DOCUMENTS OF RELATED ART

Patent Document

Korean Patent No. 10-1146163 (May 16, 2012)

SUMMARY OF THE INVENTION

The present invention has been made in view of the problems occurring in the related art, and an objective of the present invention is to improve conversion gain and noise performance of a mixer for frequency conversion used in a wireless communication system without increasing an amount of current consumed. Another objective of the present invention is to improve switching characteristics of the mixer without increasing the size of a transistor and the power of a LO signal.

In order to achieve the objectives, one aspect of the present invention provides an active mixer for improving gain and noise, the active mixer including: an active mixer block; a body signal generator; and a voltage controller. The active mixer block may include a load stage for performing voltage conversion, a switching stage for receiving a LO signal and for selectively performing a switching-on/off operation for frequency conversion, and a transconductance stage $g_m$ for receiving a radio frequency (RF) signal for amplification of the LO signal.

The switching stage may receive the LO signal and selectively perform the switching-on/off operation for frequency conversion. The body signal generator may generate a body signal to be applied to the body of an NMOS transistor of the switching stage based on the LO signal that is input to the switching stage.

The voltage controller may control the body signal generator to selectively apply the body signal to the body of the NMOS transistor of the switching stage based on the switching-on/off operation of the switching stage to control a threshold voltage of the transistor of the switching stage.

The voltage controller may apply a signal generated by the body signal generator to the body of the NMOS transistor of the switching stage to improve the switching and on-resistance characteristics of the switching stage. The body signal may be controlled such that the threshold voltage has a relatively small value when the switching state is switched on and has a relatively large value when the switching stage is switched off.

In order to achieve the objectives, another aspect of the present invention provides a method for improving gain and noise of an active mixer for frequency conversion used in a wireless communication system, the method including steps of: receiving a LO signal by a switching stage; generating a body signal to be applied to a body of an NMOS transistor of the switching stage based on the LO signal input to the switching stage by a body signal generator; selectively applying the body signal by a voltage controller to the body of the NMOS transistor of the switching stage based on a switching-on/off operation of the switching stage to control a threshold voltage of the NMOS transistor.

As described above, the active mixer and method for improving gain and noise, according to the present invention, have an advantage of improving conversion gain and noise performance without increasing current consumption. In addition, it is possible to improve switching characteristics of the switching stage of the mixer without increasing the size of the transistor and the power of the LO signal.

In addition, it is possible to improve the performance (i.e., conversion gain and noise figure) without requiring additional current consumption and a size increase of a transistor in an ultra-high/millimeter-wave frequency domain where conversion gain loss and noise are likely to be easily deteriorated.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

Figure 1A:
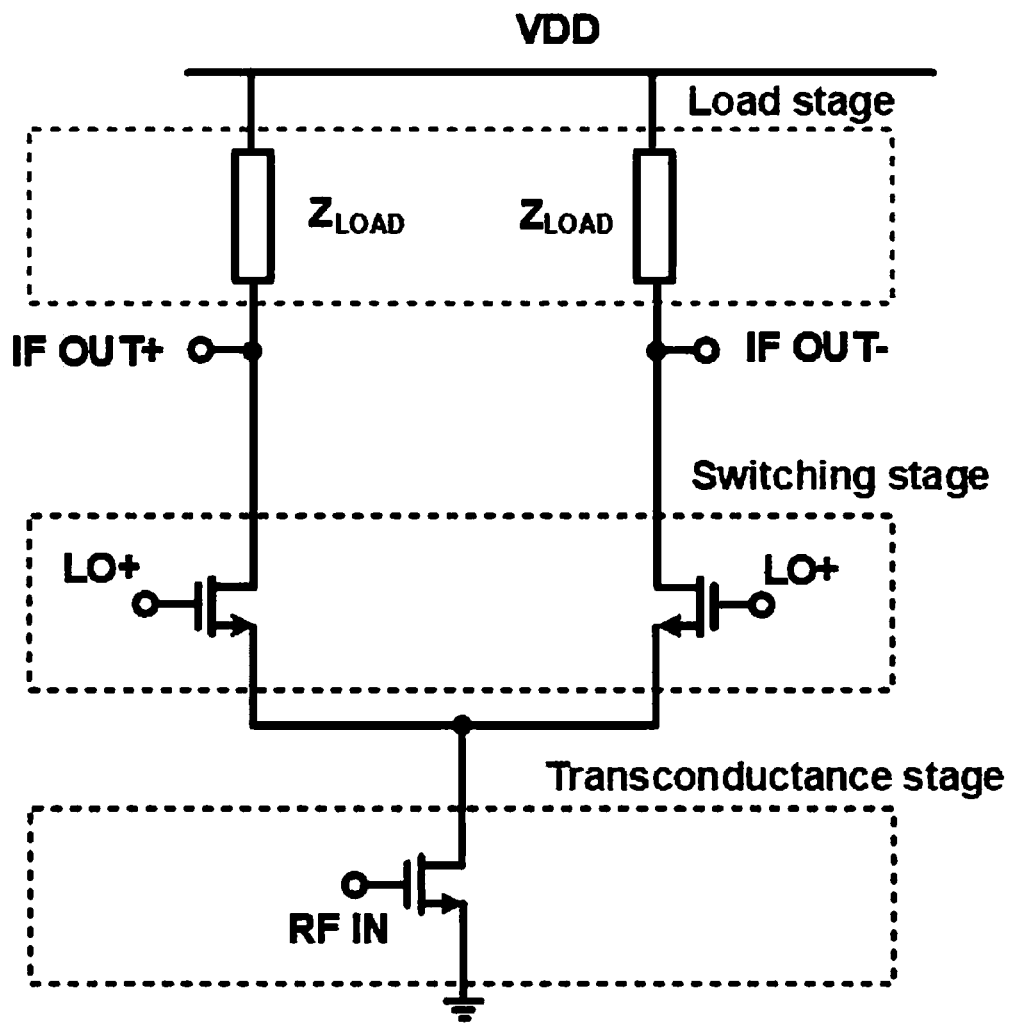
FIGS. 1A and 1B are circuitry diagrams illustrating conventional active mixers.

Herein below, exemplary embodiments of the present invention will be described in detail with reference to the accompanying drawings such that the invention can be easily practiced by those ordinarily skilled in the art to which the present invention pertains. The present disclosure can be embodied in various forms and should not be construed as being limited to the exemplary embodiments disclosed herein. Throughout the drawings, elements that are not related to the description of the present invention are omitted to clearly illustrate the claimed invention, and like elements are designated by like reference numerals.

It will be further understood that the terms "comprises" and/or "comprising", or "includes" and/or "including", or "has" and/or "having", when used in this specification, specify the presence of stated features, regions, integers, steps, operations, elements, and/or components, but do not preclude the presence or addition of one or more other features, regions, integers, steps, operations, elements, and/ or components. The terms "~part", "~unit", "module", "stage", "apparatus" and the like mean a unit for processing at least one function or operation and may be implemented by a combination of hardware and/or software.

Hereinafter, preferred embodiments of the present invention will be described in detail with reference to the accompanying drawings.

Through the drawings, like reference symbols denote like elements.

Figure 1B:
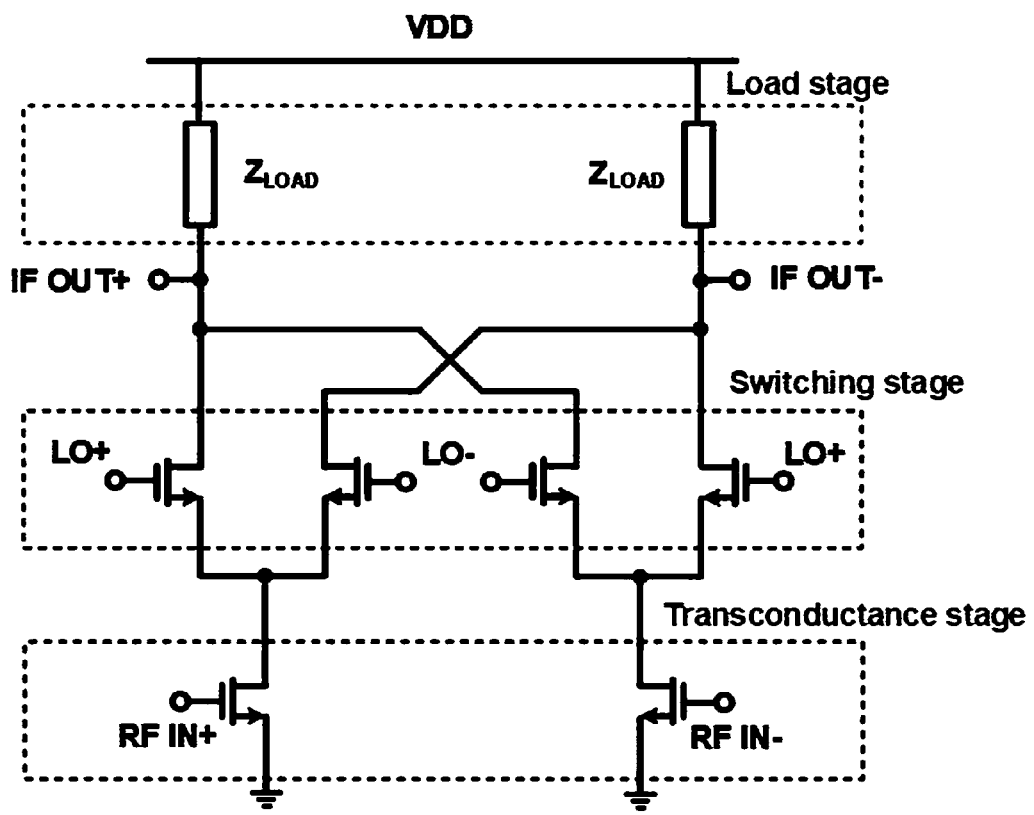
Figure 2:
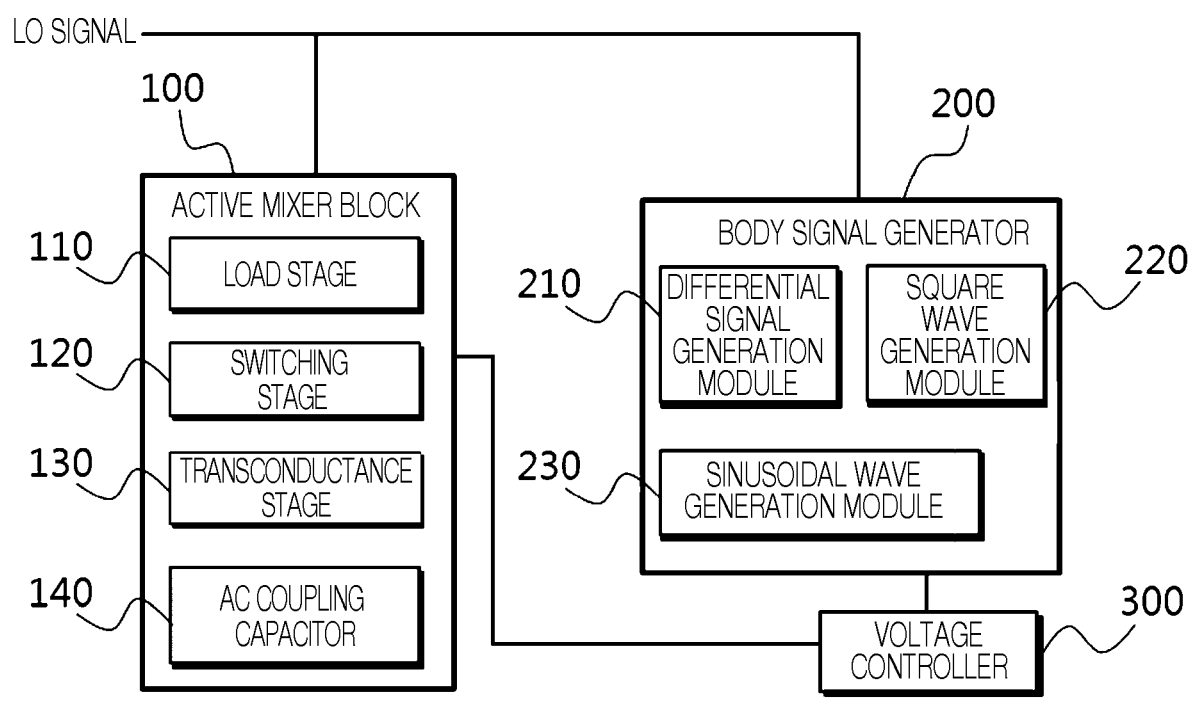
FIG. 2 is a block diagram illustrating an active mixer for improving gain and noise, according to one embodiment of the present invention.

FIGS. 1A and 1B are circuitry diagrams illustrating conventional active mixers. Specifically, FIG. 1A is a circuitry diagram illustrating a conventional single-balanced active mixer, and FIG. 1B is a circuitry diagram illustrating a conventional double-balanced active mixer. FIG. 2 is a block diagram illustrating an active mixer 10 for improving gain and noise, according to one embodiment of the present invention.

The active mixer 10 is a mixer for frequency conversion mainly used in a wireless communication system. The active mixer 10 can improve switching operation characteristics resulting in improvements of conversion gain and nose figure without increasing power consumption of a mixer block 100 while using an unchanged LO signal. Specifically, it is possible to improve a conversion gain and a noise figure without additional power consumption in a millimeter-wave frequency domain for 5G mobile communication in which a high-speed switching operation is required.

The active mixer 10 includes an active mixer block 100, a body signal generator 200, and a voltage controller 300. The active mixer block 100 includes a load stage 110 for performing voltage conversion, a switching stage for receiving a LO signal and selectively performing a switching-on/ off operation for frequency conversion, and a transconductance stage $g_m$ 130 for receiving a radio frequency (RF) signal to amplify the LO signal.

The body signal generator 200 generates a body signal to be applied to the body of an NMOS transistor of the switching stage 120 based on the LO signal input to the switching stage 120.

The body signal generator 200 includes a differential signal generation module 210 that generates a differential signal based on the LO signal input to the switching stage 120, a square wave generation module 220 that generates a square wave signal based on the LO signal input to the switching stage 120, and a sinusoidal wave signal generation module 230 that generates a sinusoidal wave signal based on the LO signal input to the switching stage 120.

The voltage controller 300 selectively applies the body signal to the body of the NMOS transistor of the switching stage 120 based on a switching-on/off operation of the switching stage 120 to control the threshold voltage $V_{TH}$ of the transistor of the switching stage 120.

That is, in order to improve the gain and noise of the active mixer 10, the voltage controller 300 controls the body signal generation unit 200 to generate the body signal such that the body signal is applied to the body of the switching stage 120. Thus, the NMOS switch has a relatively small threshold value when the switching stage 120 is switched on and the NMOS switch has a relatively large threshold value when the NMOS switch is switched off.

That is, the rising/falling time of the switching stage 120 is reduced so that the switching-on/off speed is increased.

The active mixer 10 according to one embodiment of the present invention improves conversion gain and noise figure using a body effect of the switch transistor in the switching stage 120 of the active mixer 10 that uses a metal oxide semiconductor field effect transistor (MOSFET).

The term "body effect" means a phenomenon in which the threshold voltage $V_{TH}$ of a transistor is increased due to a reverse bias voltage $V_{SB}$ between a body terminal 411/421 and a source terminal 412/422 of a transistor such as a MOSFET.

A change in threshold voltage attributable to the body effect is represented by Expression 1.

$$V_{TH} = V_{THO} + \gamma(\sqrt{|2\Phi_F + V_{SB}|} - \sqrt{|\Phi_F|}) \quad \text{[Expression 1]}$$

Here, $V_{SB}$ is a voltage difference between the source 412/422 and the body 411/121 of the transistor, and $V_{THO}$ is a threshold voltage when there is no body effect. In addition, $\Phi_F$ is a built-in potential at a PN junction between a P-type semiconductor and an N-type semiconductor 410/420, and $\gamma$ is a body effect coefficient.

In a typical complementary metal oxide semiconductor (CMOS) process, a P-type semiconductor substrate that is grounded serves as body terminals of respective NMOS transistors (N-type MOSFETs). That is, the body terminals of the respective NMOS transistors are directly connected to the P-type semiconductor substrate. In each NMOS transistor serving as a switching element in the switching stage of the active mixer, since the source voltage $V_S$ is set to a positive value, the threshold voltage of the NMOS switching transistor is always high due to the body effect.

Figure 3A:
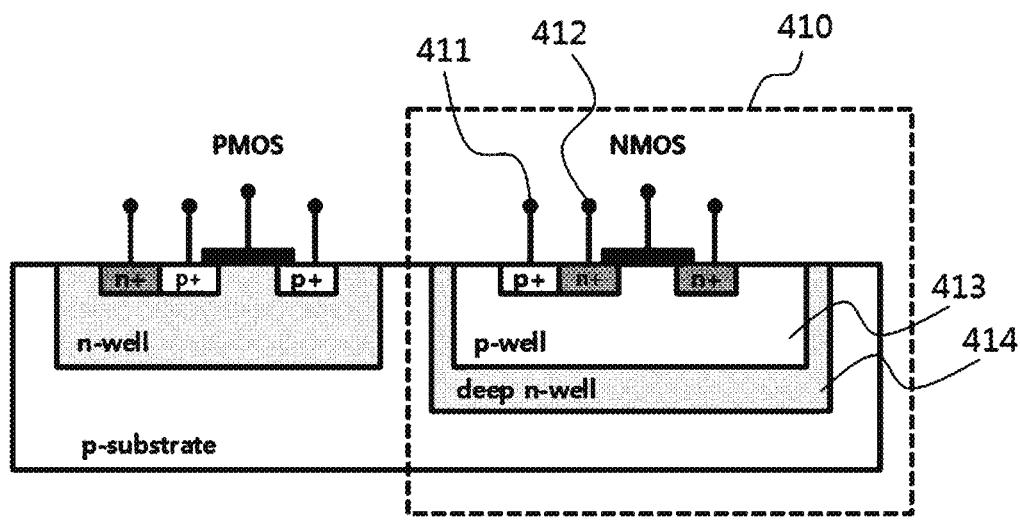
FIG. 3A is a cross-sectional view illustrating a CMOS device manufactured through a deep N-well CMOS process.
Figure 3B:
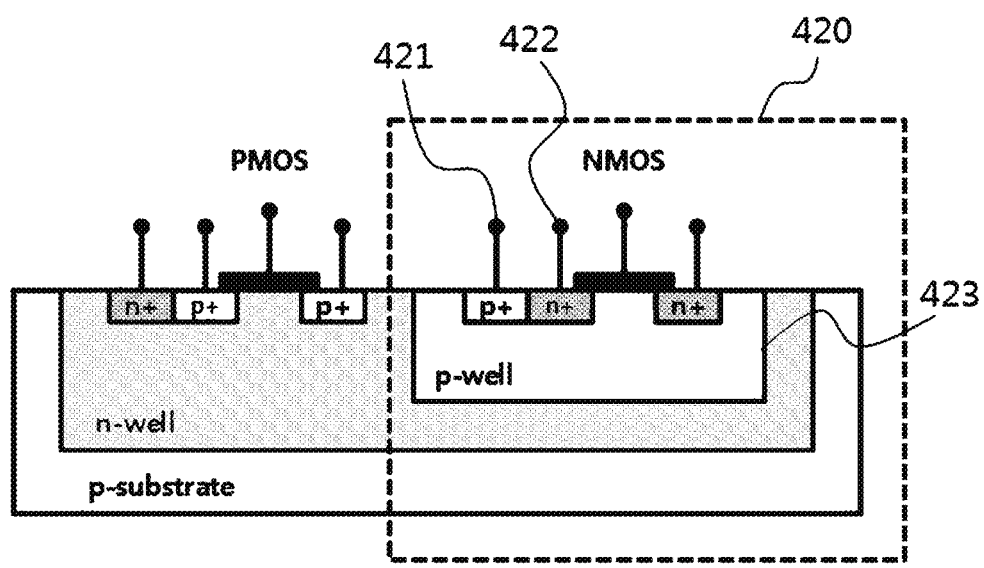
FIG. 3B is a cross-sectional view illustrating a CMOS device manufactured through a triple-well CMOS process.

FIG. 3A is a cross-sectional view illustrating a CMOS device manufactured through a deep N-well CMOS process, and FIG. 3B is a cross-sectional view illustrating a CMOS device manufactured through a triple-well CMOS process.

As shown in FIGS. 3A and 3B, in a deep N-well CMOS process or a triple-well CMOS process that exhibit excellent RF characteristics, since each NMOS transistor 410/420 in a CMOS circuit is formed in an independent P-well 413/423, each NMOS transistor 410/420 can be applied with a different body voltage.

In the active mixer 10 according to one embodiment of the present invention, the transistors in the switching stage are manufactured through a deep N-well CMOS process or a triple-well CMOS process. Therefore, it is possible to selectively apply a voltage correction signal to the body of each NMOS transistor with the use of the voltage controller 300. Therefore, the threshold voltage of each NMOS transistor can be individually controlled.

In this case, a body voltage $V_B$ applied to the body 411 of each of the NMOS transistors is required to satisfy the condition "$V_B \leq V_S$" to maintain a reverse bias state at the PN junction between a deep N-well 414 and a P-well 413.

When controlling the body voltage to improve the switching characteristics and on-resistance 121 of the NMOS transistors (i.e., switches), the voltage controller 300 controls the body voltage such that the threshold voltage $V_{TH}$ has a relatively small value when the switch is turned on and the threshold voltage $V_{TH}$ has a relatively large value when the switch is turned off.

At the time of performing a switching-on operation, the level of the LO signal increases and the threshold voltage of the transistor decreases. Therefore, the switch can be more quickly turned on.

Conversely, at the time of performing a switching-off operation, the level of the LO signal decreases, a gate-source voltage $V_{GS}$ decreases, and the threshold voltage $V_{TH}$ increases. Thus, the switch can be more quickly turned off.

Expression 2 represents the on-resistance $R_{ON}$ 121 of the switch.

$$R_{ON} = \frac{1}{\mu_n C_{ox} \frac{W}{L}(V_{GS} - V_{TH})} \quad \text{[Expression 2]}$$

Here, $\mu_n$ and $C_{ox}$ respectively represent mobility and oxide capacitance of the NMOS transistor 410/420. W and L respectively represent the width and the length of the NMOS transistor 410/420.

As represented by Expression 2, even after the switch is turned on, the on-resistance $R_{ON}$ 121 of the switch is weak because the threshold voltage $V_{TH}$ is low. Therefore, by controlling the threshold voltage of the switch through the body voltage control, it is possible to achieve a faster switching operation and a reduced on-resistance 121 of the switch.

In addition, it is possible to improve a conversion gain and a noise figure without changing the LO signal and the transistor size.

Figure 4:
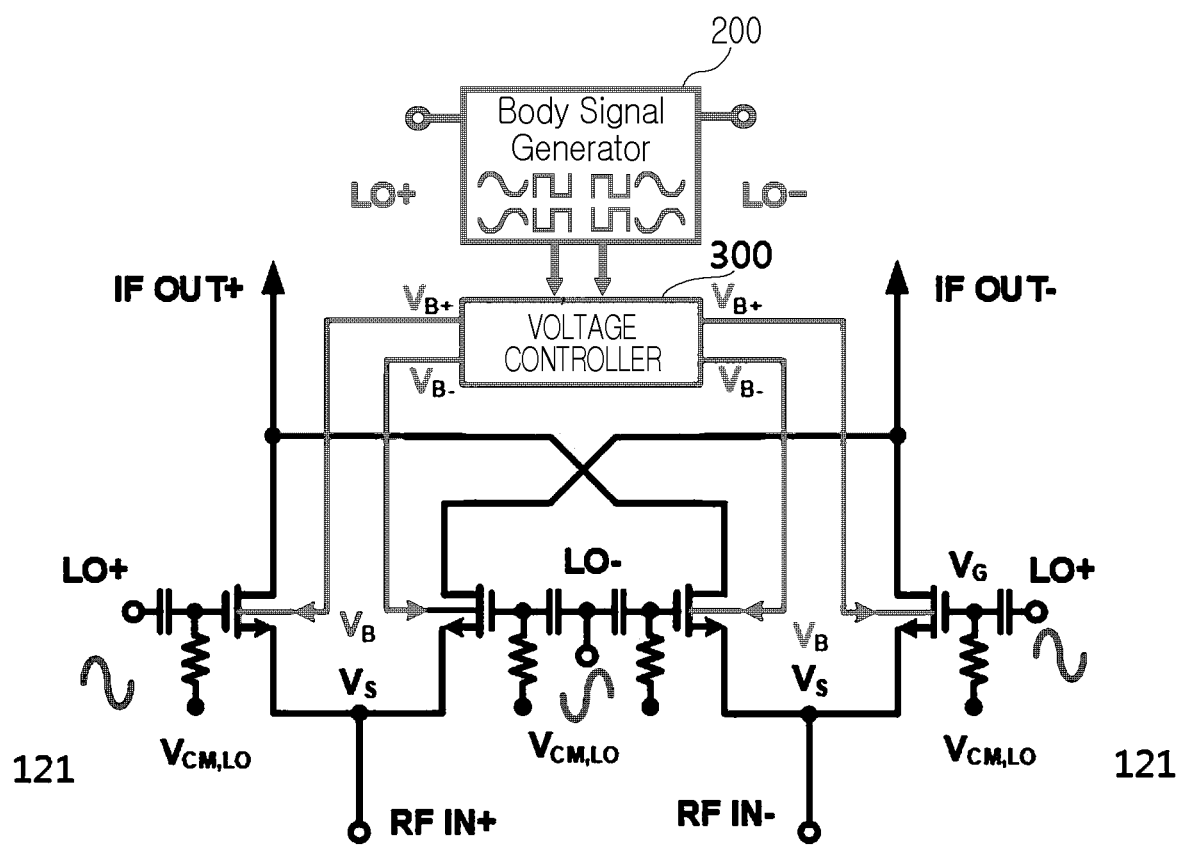
FIG. 4 is a circuitry diagram illustrating a switch of a double-balanced active mixer to which a body voltage control method according to one embodiment of the present invention is applied.

FIG. 4 is a circuitry diagram illustrating a switch of a double-balanced active mixer to which a body voltage control method according to one embodiment of the present invention is applied. That is, the threshold voltage control is performed on the switching stage of the double balanced active mixer 10 through the control of the body voltage of the switching stage.

As illustrated in FIG. 4, when a LO common voltage $V_{CM,LO}$ and a LO signal are applied to the gate terminal of the switch of the active mixer 10, a differential body voltage to be applied to the body of the switch is generated by the differential signal generation module 210 and the generated differential body voltage is applied to the body of the switching transistor under control of the voltage controller 200. In this case, the body voltage can also be controlled as a differential signal according to a differential LO signal applied to the gate terminal of the switch of the active mixer 10.

Figure 5A:
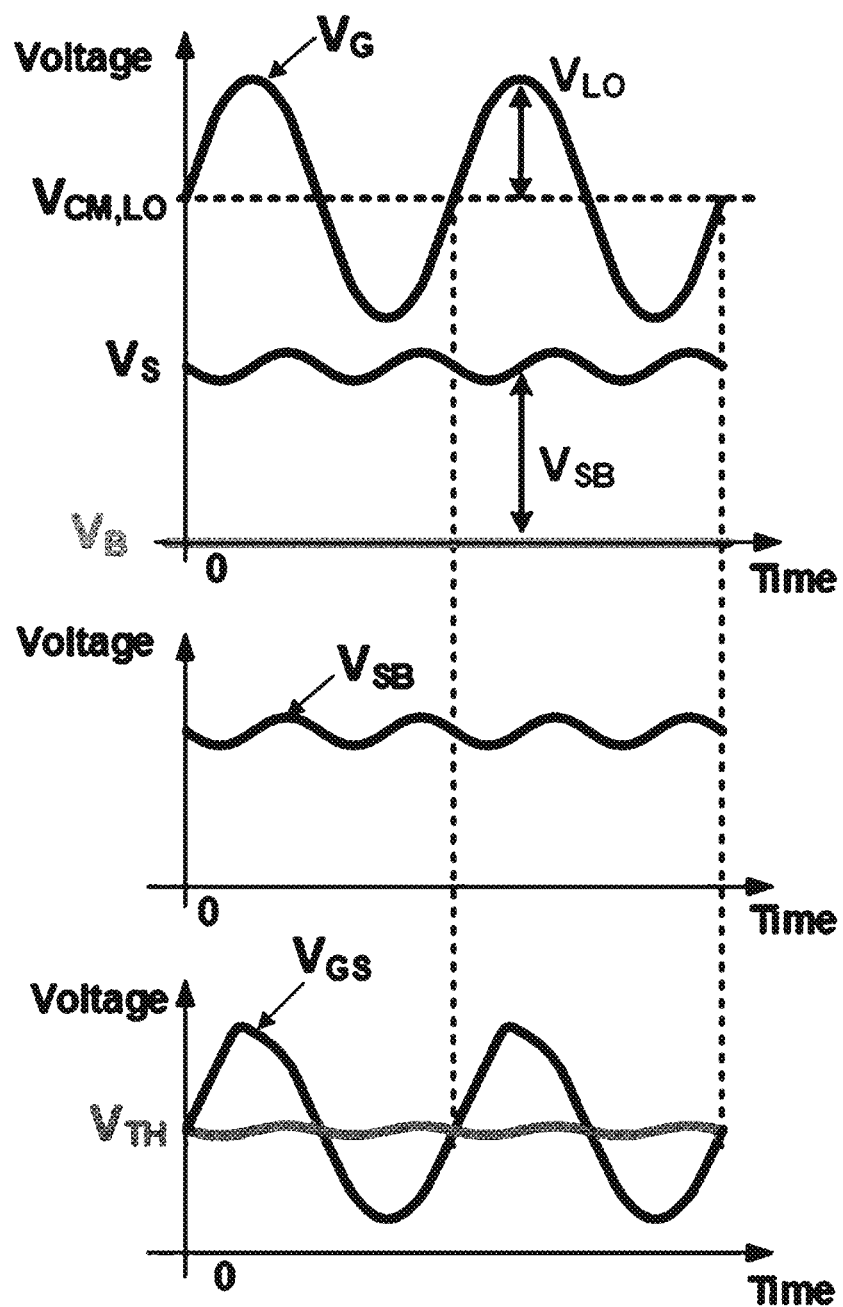
FIGS. 5A, 5B, and 5C are diagrams illustrating changes in threshold voltage of a switch according to a body voltage.
Figure 5B:
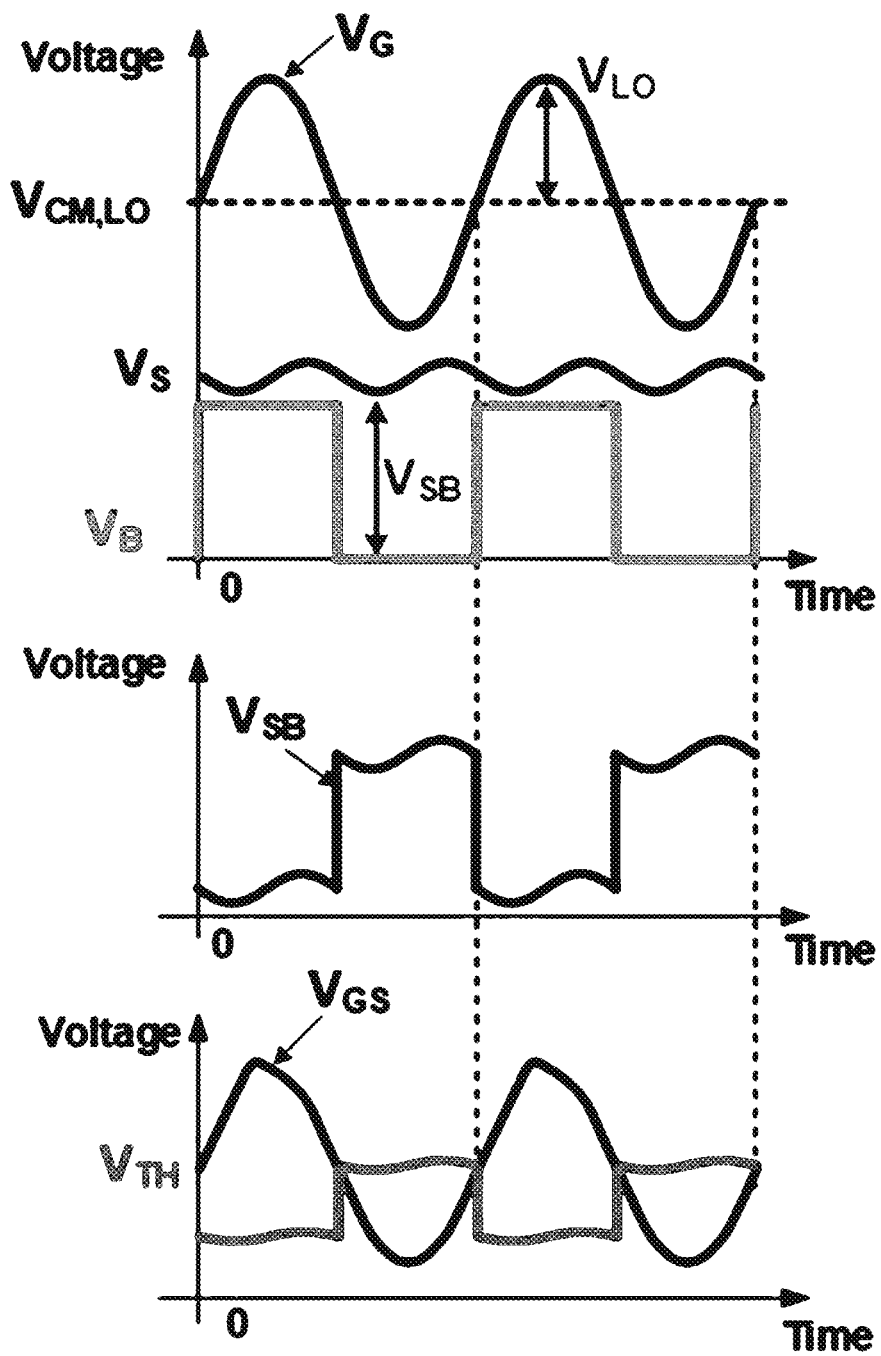
Figure 5C:
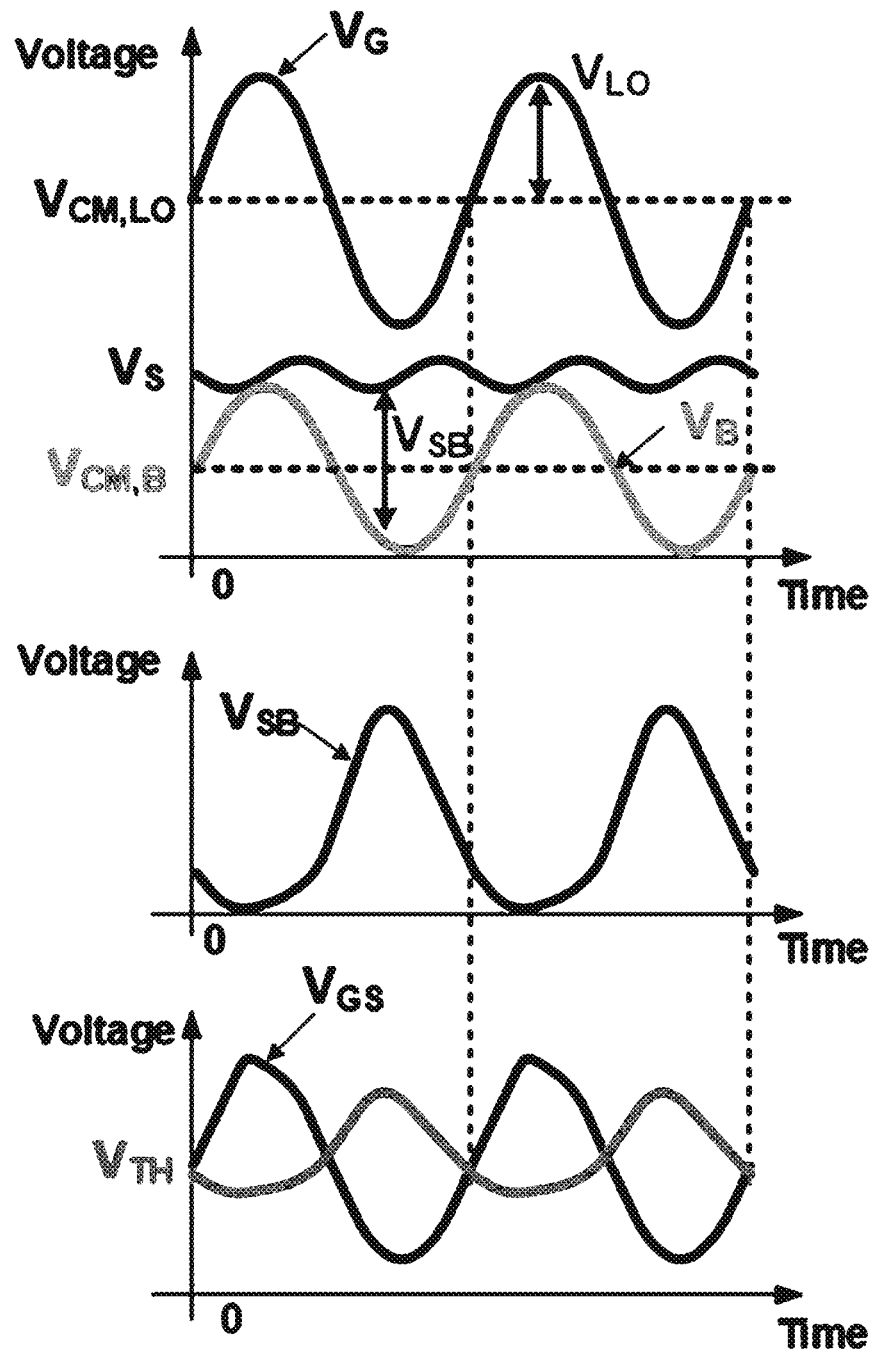

FIGS. 5A, 5B, and 5C are waveforms illustrating changes in threshold voltage of a switch depending changes in body voltage. That is, when the body voltage $V_B$ applied to the active mixer 10 changes, a voltage at each terminal of each switching transistor swings and a threshold voltage of each switching transistor changes.

In FIGS. 5A, 5B, and 5C, it is assumed that a LO signal having a frequency of $f_{LO}$ and a voltage of $V_{LO}$ is applied. In this case, a signal having a frequency of $2f_{LO}$ appears at the source terminal of the switching transistor due to leakage of the LO signal attributable to the gate-source capacitance $C_{gs}$ of the NMOS switching transistor 410/420.

FIG. 5A is a diagram illustrating changes in threshold voltage of a switching transistor when the applied body voltage $V_B$ is set to zero. That is, FIG. 5A illustrates a case in which the body voltage is grounded in the active mixer. As illustrated in FIG. 5A, almost no change occurs in the value of the threshold voltage $V_{TH}$ of the NMOS switching transistor 410/420.

FIG. 5B is a diagram showing changes in the threshold voltage of the switching transistor in a case where a square wave signal (at a frequency of $f_{LO}$) is applied as the body voltage $V_B$, FIG. 5C is a diagram showing changes in the threshold voltage of the switching transistor in a case where a sinusoidal wave signal (at a frequency of $f_{LO}$) is applied as the body voltage $V_B$.

While a square wave signal generated by the square wave generation module 220 is applied to the body of the switching transistor in the example of FIG. 5B, a sinusoidal wave signal generated by the sine wave generation module 230 is applied to the body of the switching transistor in the example of FIG. 5C.

When a square wave signal or a sinusoidal wave signal that is matched in frequency with the LO signal is applied to the body of the switching transistor, as illustrated in FIGS.

5B and 5C, the threshold voltage $V_{TH}$ is increased when the switching transistor is turned off but the threshold voltage $V_{TH}$ is decreased when the switching transistor is turned on. In this case, it is preferable that the applied body voltage satisfies a condition of "$V_{SB}$>0" to maintain a reverse bias state.

Figure 6:
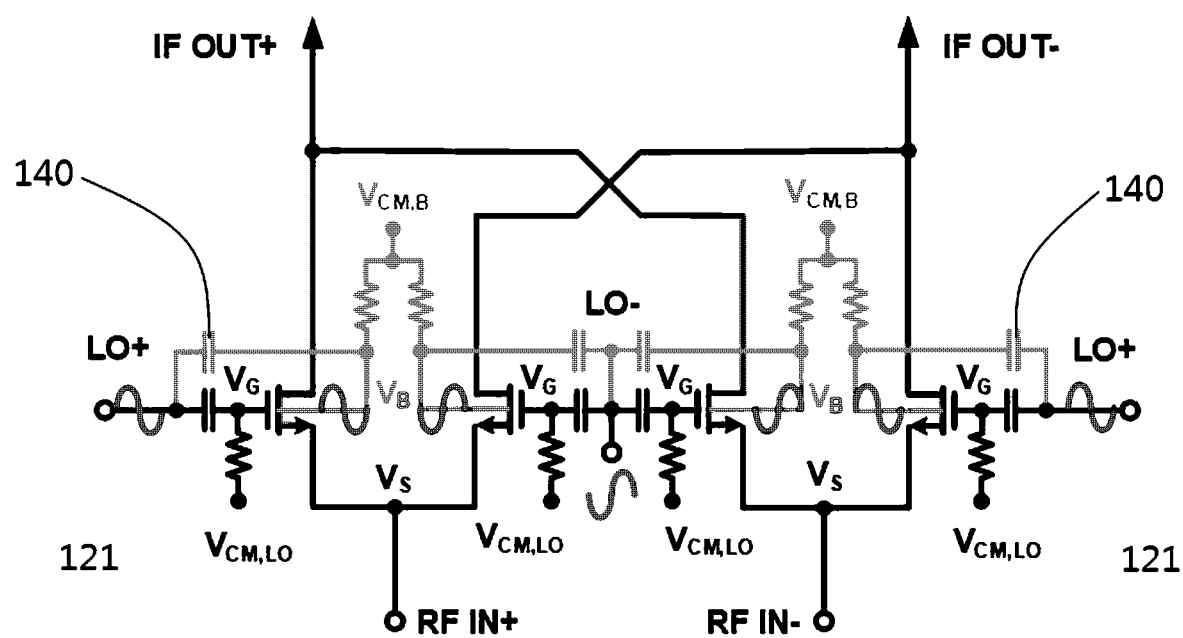
FIG. 6 is a circuitry diagram illustrating an active mixer for improving gain and noise, according to another embodiment of the present invention.

FIG. 6 is a block diagram illustrating a high-gain low-noise active mixer 10 according to another embodiment of the present invention. Referring to FIG. 6, the active mixture 10 is configured such that a sinusoidal wave signal is generated by a sinusoidal wave generation module 230 and is then applied to the body of a switching transistor.

In a case where a body voltage in the form of a square wave signal is applied as illustrated in FIG. 5B, there is an advantage that the threshold voltage $V_{TH}$ quickly changes. However, this case has a problem in that an additional LO buffer circuit and additional power consumption are required to generate the square wave signal. In addition, it is difficult to generate a square wave signal in a substantially millimeter wave frequency domain.

On the other hand, in a case where a body voltage in the form of a sinusoidal wave signal is applied as illustrated in FIG. 5C, the sinusoidal wave generation module 230 generates a sinusoidal wave signal based on the LO signal (at a frequency of $f_{LO}$) input to the switching stage 120. Therefore, with the use of an AC coupling capacitor 140 that performs AC coupling as illustrated in FIG. 6, the body voltage can be controlled through the control of the body signal without requiring additional current consumption.

That is, the AC coupling capacitor 140 is connected to the body of the switching transistor of the switching stage 120 to control the body voltage through the control of the LO signal. In this case, as illustrated in FIG. 6, the reverse bias between the body and the source can be maintained through the adjustment of the common voltage $V_{CM,B}$.

Figure 7A:
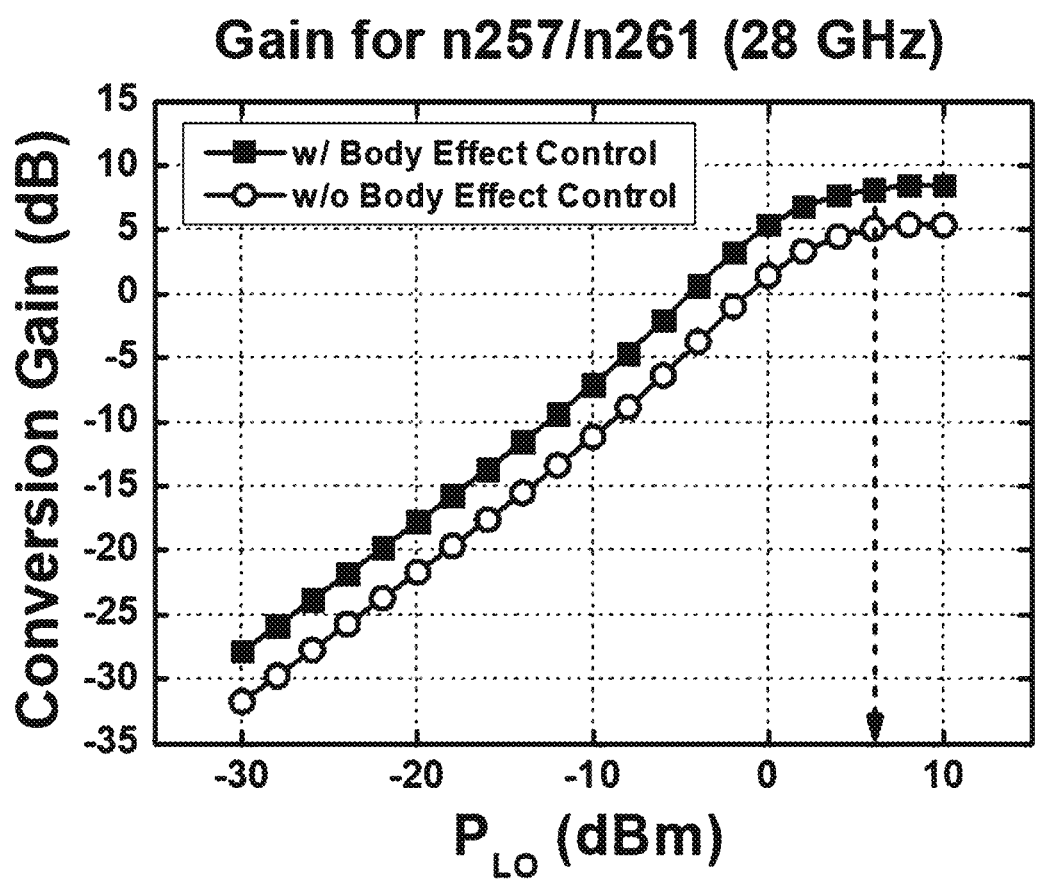
FIGS. 7A and 7B are graphs illustrating changes in conversion gain of the active mixer according to a LO signal that is input.
Figure 7B:
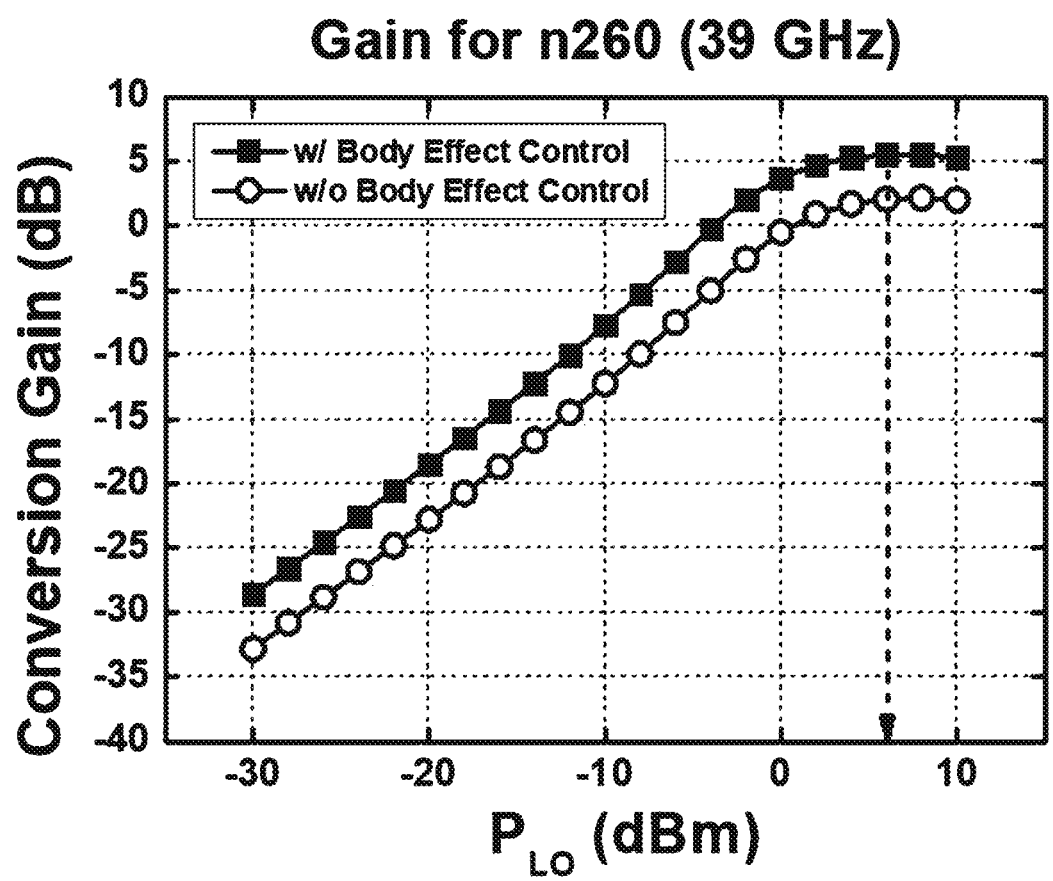
Figure 8A:
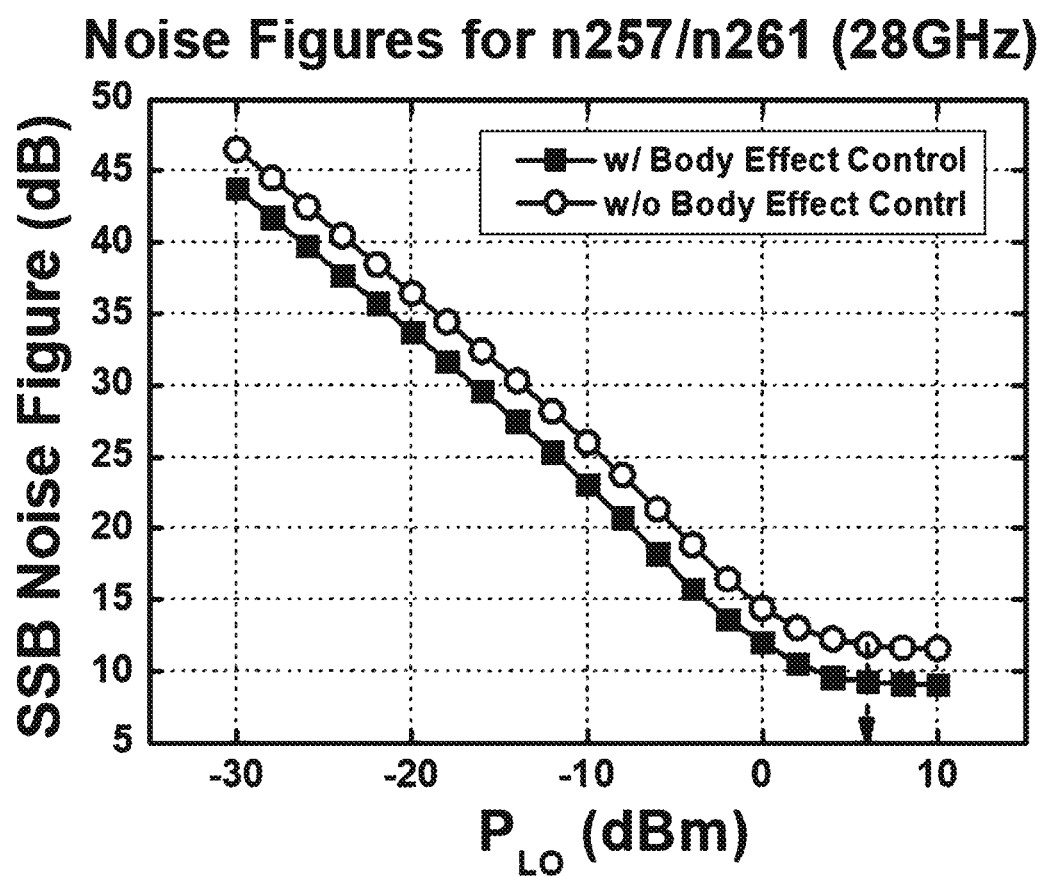
FIGS. 8A and 8B are graphs illustrating changes in noise figure of the active mixer according to a LO signal that is input.
Figure 8B:
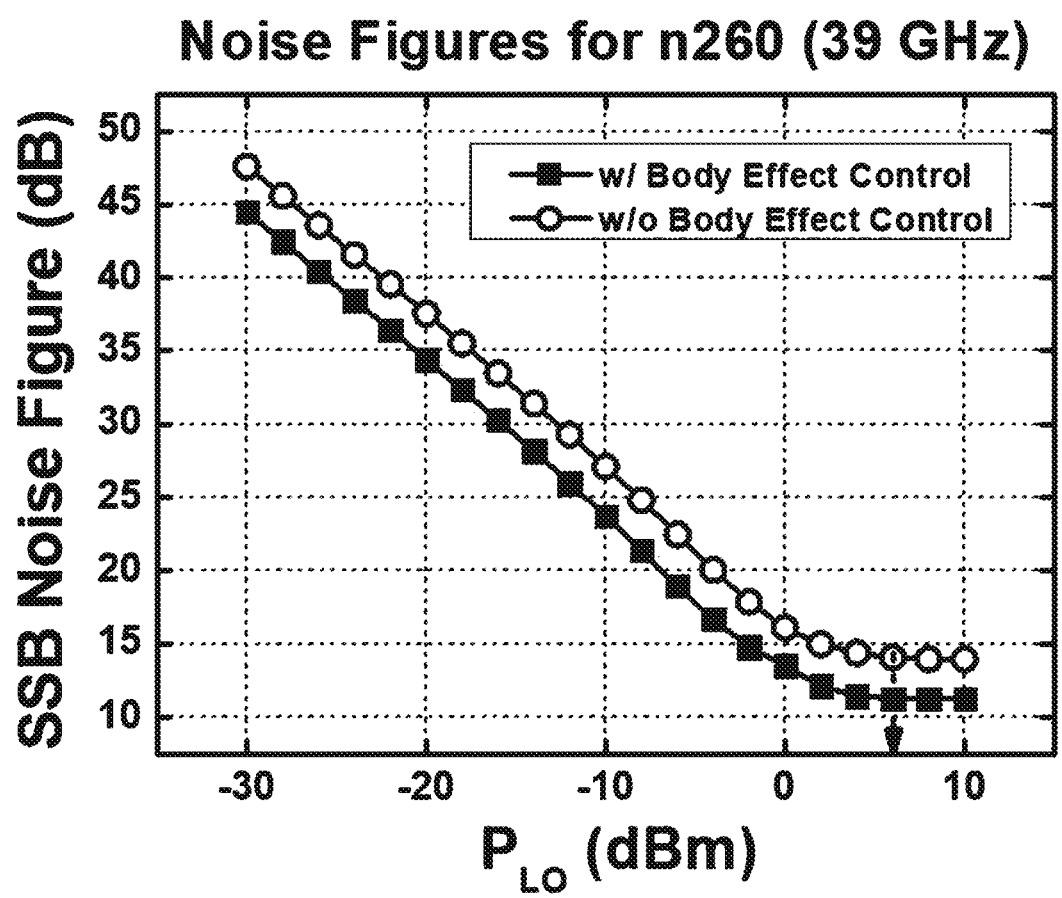

FIGS. 7A and 7B are diagrams showing the conversion gain of the active mixer 10 according to the LO signal that is input, and FIGS. 8A and 8B are diagrams showing the noise figure of the active mixer 10 according to the LO signal that is input. Specifically, FIGS. 7A and 7B and FIGS. 8A and 8B are diagrams showing simulation results of a frequency down-conversion active mixer based on a 65-nm CMOS process, in which the active mixer has the same structure as the active mixer 10 of FIG. 6.

FIGS. 7A and 8A are the simulation results for n257 and n261 (26.5 to 29.5 GHz) of 5G NR frequency bands in a millimeter wave frequency domain, and FIGS. 7B and 8B are simulation results for n260 (37 to 40 GHz).

FIGS. 7A, 7B, 8A, and 8B show simulation results of conversion gain and noise figure (NF) with or without body voltage control for each frequency band according to a LO signal.

In both the cases of FIGS. 7A and 7B, the conversion gain of the active mixer 10 increases with the level of the LO signal $P_{LO}$ that is input. However, the case in which the body voltage control is performed, a higher conversion gain as much as 3 to 4 DB is obtained compared to the case in which the body voltage control is not performed.

This means that with the body voltage control, a lower-level LO signal $P_{LO}$ and less power consumption are required for the same conversion gain. The simulation result for a frequency of 28 GHz illustrated in FIG. 7A proves that LO signals $P_{LO}$ of 0 dBm and 6 dBm are required to obtain a conversion gain of 5 dB with and without the body voltage control, respectively.

Similarly, it is confirmed from FIGS. 8A and 8B that the noise figure of the active mixer 10 is improved through the body voltage control. Referring to FIGS. 8A and 8B, a single-sideband noise figure (SSB NF) is improved by 2.5 to 3 dB in the case where the body voltage control is performed.

That is, in the simulation result for a frequency of 28 GHz illustrated in FIG. 8A, when $P_{LO}$=6 dBm, the SSB NF values are 9.28 dB and 11.84 dB with and without the body voltage control, respectively. That is, the simulation results show that the active mixer 10 according to one embodiment of the present invention can improve a conversion gain and a noise figure.

As described above, the active mixer 10 according to the present invention is an active mixer implemented with NMOS transistors 410/420. In the active mixer 10, the threshold voltage of the NMOS transistor is adjusted through the body voltage control so that the switching characteristics and on-resistance 121 of the NMOS transistor 410/420 are improved. In addition, it is possible to improve gain and noise figure without requiring additional power consumption for LO input or transconductance and without increasing the size of transistors.

Figure 9:
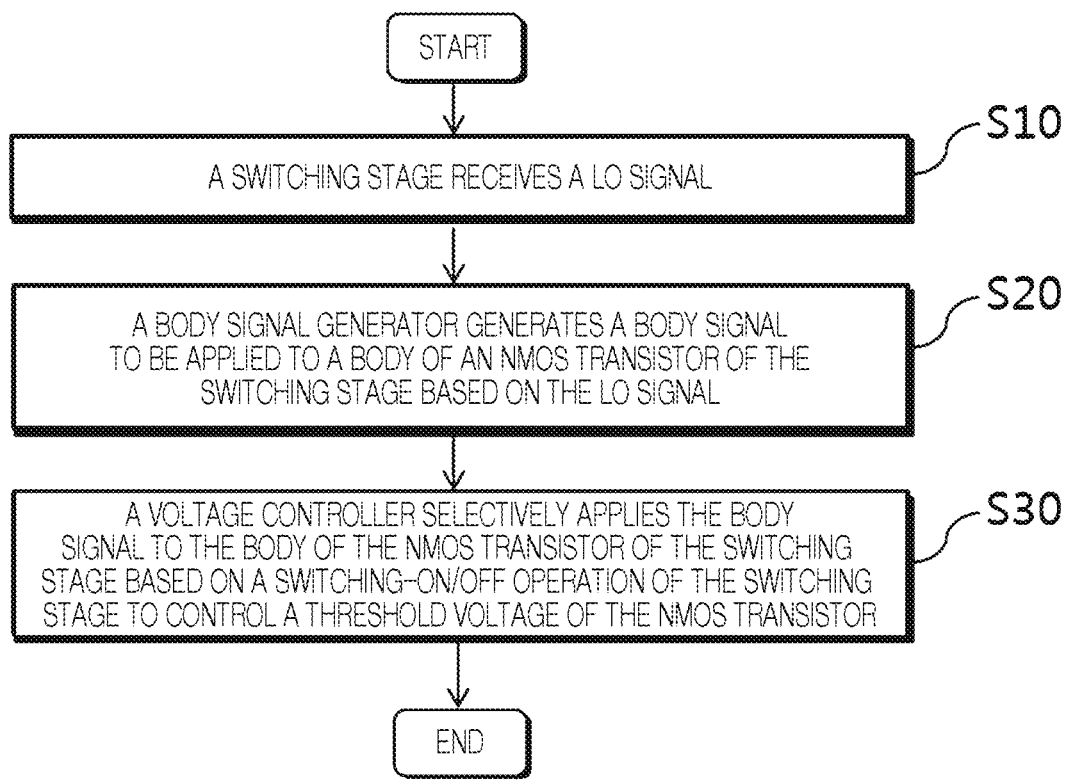
FIG. 9 is a flowchart illustrating a method for improving gain and noise of an active mixer, according to one embodiment of the present invention.

FIG. 9 is a flowchart illustrating a method for improving gain and noise of an active mixer according to one embodiment of the present invention. The method for improving gain and noise of an active mixer 10 according to one embodiment of the present invention includes: step S10 in which a switching stage 120 receives a signal (hereinafter, referred to as LO signal) from a local oscillator; step S20 in which a body signal generator 200 generates a body signal to be applied to the body of an NMOS transistor of the switching stage based on the LO signal input to the switching stage; and step S30 in which a voltage controller selectively applies the body signal to the body of the NMOS transistor of the switching stage based on a switching operation of the switching stage to control the threshold voltage of the NMOS transistor.

In step S30 in which the body signal is applied to the body of the NMOS transistor, the voltage controller 300 controls the body signal generator 200 to improve the switching characteristics and on-resistance of the switching stage 120. When the body signal is applied to the body of the switching stage 120, the body signal is controlled such that the threshold voltage $V_{TH}$ has a relatively small value when the switching stage 120 is switched on and has a relatively large value when the switching stage 120 is switched off.

In addition, the body signal generated in step S20 is one signal selected from among a differential signal that varies depending on a LO signal input to the switching stage 120, a square wave signal generated based on the LO signal input to the switching stage 120, and a sinusoidal wave signal generated based on the LO signal input to the switching stage 120.

In the active mixer 10, an AC coupling capacitor 140 that performs AC coupling is added to the body of the switching stage 120. Therefore, it is possible to control the body voltage through the adjustment of the body signal without additional power consumption. That is, in order to control the body voltage with the LO signal that is input, the AC coupling capacitor 140 is connected to the body of the transistor of the switching stage 120.

The active mixer 10 and the active mixing method according to the present invention can improve switching and on-resistance characteristics of a NMOS transistor serving as a switching device included in the active mixer 10 by adjusting the threshold voltage of the NMOS transistor through the control of the body voltage.

Although the preferred embodiments of the present invention have been described above, the ordinarily skilled in the art will appreciate that the present invention is not limited to the above embodiments, modifications and changes to the embodiments are possible, and all equivalents, modifications, changes to the embodiments fall within the scope of the invention as defined in the appending claims.

What is claimed is:

1. An active mixer for frequency conversion used in a wireless communication system to improve gain and noise, the active mixer comprising:
   a switching stage for receiving a local oscillator (LO) signal and selectively performing a switching-on/off operation for frequency conversion;
   a body signal generator for generating a body signal to be applied to a body of an NMOS transistor of the switching stage based on the LO signal input to the switching stage; and
   a voltage controller for controlling the body signal generator to selectively apply the body signal to the body of the NMOS transistor of the switching stage based on the switching-on/off operation of the switching stage to control a threshold voltage of the NMOS transistor of the switching stage.

2. The active mixer according to claim 1, wherein the body signal is a differential signal based on to the LO signal input to the switching stage.

3. The active mixer according to claim 1, wherein the body signal is a square wave signal or a sinusoidal wave signal based on the LO signal input to the switching stage.

4. The active mixer according to claim 1, wherein a body voltage applied to the body of the NMOS transistor via the body signal has a voltage level equal to or lower than a source voltage applied to a source of the NMOS transistor to keep a PN junction between a source and a P-type body in the transistor of the switching stage in a reversed bias state.

5. The active mixer according to claim 1, wherein the voltage controller controls the body signal generator to apply the body signal to the body of the NMOS transistor of the switching stage such that the threshold voltage has a relatively small value when the switching state is switched on and has a relatively large value when the switching state is switched off, to improve switching and on-resistance characteristics of the switching stage.

6. A method for improving gain and noise of an active mixer used for frequency conversion used in a wireless communication system, the method comprising steps of:
   receiving a local oscillator (LO) signal by a switching stage of the active mixer (S10);
   generating a body signal to be applied to a body of an NMOS transistor of the switching stage based on the LO signal input to the switching stage by a body signal generator (S20); and
   selectively applying the body signal by a voltage controller to the body of the NMOS transistor of the switching stage based on a switching-on/off operation of the switching stage to control a threshold voltage of the NMOS transistor of the switching stage (S30).

7. The method according to claim 6, wherein in the step of selectively applying the body signal, the voltage controller controls the body signal generator to apply the body signal to the body of the NMOS transistor of the switching stage such that the threshold voltage has a relatively small value when the switching state is switched on and has a relatively large value when the switching stage is switched off, to improve switching and on-resistance characteristics of the switching stage.

\* \* \* \* \*